United States Patent
Paz de Araujo et al.

(10) Patent No.: US 10,038,141 B2
(45) Date of Patent: Jul. 31, 2018

(54) FABRICATION OF CORRELATED ELECTRON MATERIAL DEVICES

(71) Applicant: ARM Ltd., Cambridge (GB)

(72) Inventors: Carlos Alberto Paz de Araujo, Colorado Springs, CO (US); Kimberly Gay Reid, Austin, TX (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/463,546

(22) Filed: Mar. 20, 2017

(65) Prior Publication Data

US 2017/0213961 A1    Jul. 27, 2017

Related U.S. Application Data

(63) Continuation of application No. 15/006,889, filed on Jan. 26, 2016, now Pat. No. 9,627,615.

(51) Int. Cl.
| | |
|---|---|
| *H01L 47/00* | (2006.01) |
| *H01L 45/00* | (2006.01) |
| *G11C 13/00* | (2006.01) |
| *C23C 16/455* | (2006.01) |
| *C23C 16/56* | (2006.01) |

(52) U.S. Cl.
CPC .... *H01L 45/1616* (2013.01); *C23C 16/45553* (2013.01); *C23C 16/56* (2013.01); *G11C 13/004* (2013.01); *G11C 13/0069* (2013.01); *H01L 45/04* (2013.01); *H01L 45/122* (2013.01); *H01L 45/1233* (2013.01); *H01L 45/1253* (2013.01); *H01L 45/146* (2013.01); *H01L 45/147* (2013.01); *H01L 45/1633* (2013.01); *H01L 45/1641* (2013.01); *G11C 2013/0045* (2013.01); *G11C 2013/0078* (2013.01)

(58) Field of Classification Search
CPC ............... H01L 45/1616; H01L 45/122; H01L 45/1233; H01L 45/1253; H01L 45/146; H01L 45/147; H01L 45/1641; C23C 16/45553; C23C 16/56; G11C 13/004; G11C 13/0069
USPC .......................................................... 257/4
See application file for complete search history.

(56) References Cited

U.S. PATENT DOCUMENTS

| | | | |
|---|---|---|---|
| 5,138,520 | A | 8/1992 | McMillan et al. |
| 6,511,718 | B1 | 1/2003 | Paz De Araujo et al. |
| 7,298,640 | B2 | 11/2007 | Chen et al. |
| 7,639,523 | B2 | 12/2009 | Celinska |
| 7,778,063 | B2 | 8/2010 | Brubaker et al. |

(Continued)

FOREIGN PATENT DOCUMENTS

WO    2008/058264 A2    5/2008

OTHER PUBLICATIONS

U.S. Appl. No. 15/006,889, filed Jan. 26, 2016, 57 pages.

(Continued)

*Primary Examiner* — Tu-Tu Ho
(74) *Attorney, Agent, or Firm* — Berkeley Law & Technology Group, LLP

(57) ABSTRACT

Subject matter disclosed herein may relate to fabrication of correlated electron materials used, for example, to perform a switching function. In embodiments, precursors, in a gaseous form, may be utilized in a chamber to build a film of correlated electron materials comprising various impedance characteristics.

14 Claims, 8 Drawing Sheets

(56) References Cited

U.S. PATENT DOCUMENTS

| | | |
|---|---|---|
| 7,872,900 B2 | 1/2011 | Paz de Araujo et al. |
| 9,627,615 B1 | 4/2017 | Reid et al. |
| 2008/0106925 A1 | 5/2008 | Paz de Araujo |
| 2008/0107801 A1 | 5/2008 | Celinska et al. |
| 2009/0074983 A1 | 3/2009 | Heys |
| 2010/0085801 A1* | 4/2010 | Sorenson ............ H01L 51/0591 365/151 |
| 2013/0285699 A1 | 10/2013 | McWilliams et al. |
| 2013/0288427 A1 | 10/2013 | Hung |
| 2014/0030436 A1 | 1/2014 | Knapp |
| 2014/0175355 A1 | 6/2014 | Wang |
| 2016/0163978 A1 | 6/2016 | Paz De Araujo et al. |

OTHER PUBLICATIONS

U.S. Appl. No. 15/385,719, filed Dec. 20, 2016, 111 pages.
U.S. Appl. No. 15/046,177, filed Feb. 17, 2016, 66 pages.
PCT/GB2017/050396: International Search Report and Written Opinion, dated May 8, 2017, 16 pages.
PCT/GB2017/050184: International Search Report and Written Opinion, dated Apr. 7, 2017, 20 pages.
PCT/GB2017/050182: International Search Report and Written Opinion, dated Apr. 7, 2017, 14 pages.

* cited by examiner

202

260

Expose a substrate, in a chamber, to two or more precursors, in a gaseous or vapor form, that combine before or at the substrate, wherein a first precursor comprises a transition metal or transition metal oxide and a first ligand, with a second ligand. The second precursor molecule comprising oxygen, carbon, or nitrogen.

Expose a substrate (heated or at room temperature) in a chamber to reactant(s) by producing a vapor of a source material via heating a source comprising the material, or by sputtering the material from a target comprising the material, and depositing the vaporized material on the substrate. (An example may be to sputter a nickel oxide target under vacuum with a nearby substrate or a substrate within line-of-sight to permit deposition of nickel oxide onto the substrate.)

272

Alternatively, a metal (such as nickel) may be sputtered from a target and the transition metal oxide formed in a subsequent oxidation process.

273

Alternatively, a metal or metal oxide may be sputtered in a chamber comprising gaseous carbon with or without oxygen.

*FIG. 2C*

FABRICATION OF CORRELATED ELECTRON MATERIAL DEVICES

RELATED APPLICATIONS

This application is a continuation of U.S. application Ser. No. 15/006,889, entitled "FABRICATION OF CORRELATED ELECTRON MATERIAL DEVICES," filed Jan. 26, 2016, which is assigned to the assignee hereof and is expressly incorporated herein by reference.

BACKGROUND

Field

Subject matter disclosed herein relates to correlated electron devices, and may relate, more particularly, to approaches toward fabricating correlated electron switching devices exhibiting desirable impedance characteristics.

Information

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, and so forth. Factors related to electronic switching devices, such as may be incorporated in memory and/or logic devices, which may be of interest to a designer in considering suitability for any particular application may include physical size, storage density, operating voltages, impedance ranges, and/or power consumption, for example. Other example factors that may be of interest to designers may include cost of manufacture, ease of manufacture, scalability, and/or reliability. Also, there appears to be an ever-increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings, in which:

FIGS. 2A-2C show simplified flowcharts of methods for fabricating correlated electron material films according to one or more embodiments;

Figure 1A:
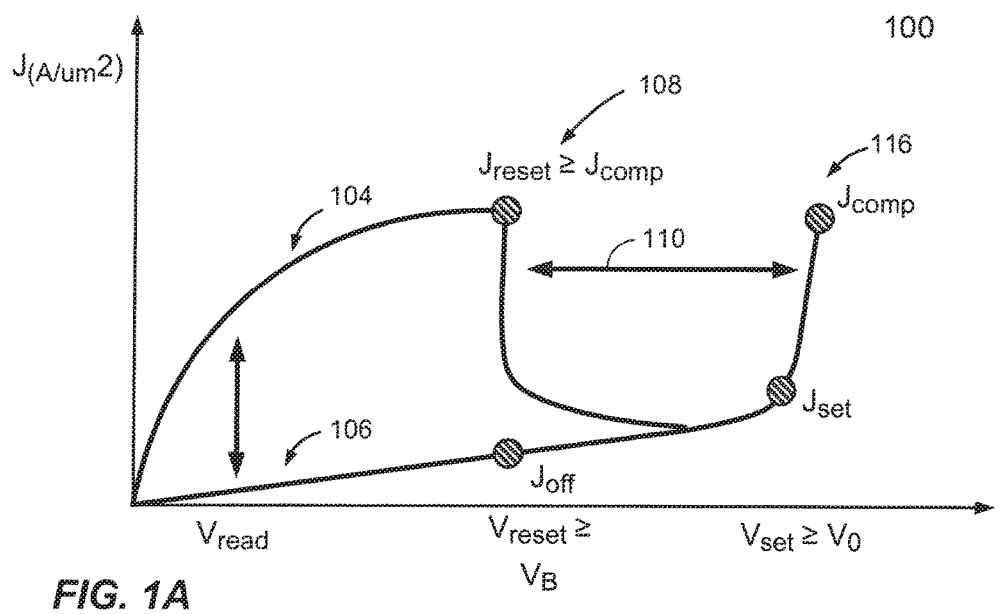
FIG. 1A is a diagram showing an example current density versus voltage profile of a device formed from a correlated electron material according to an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Additionally, it is to be understood that other embodiments may be utilized. Further, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to "one implementation," "an implementation," "one embodiment," "an embodiment," and/or the like, means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled," "connected," and/or similar terms are used generically. It should be understood that these terms are not intended as synonyms. Rather, "connected" is used generically to indicate that two or more components, for example, are in direct physical, including electrical, contact; while "coupled" is used generically to mean that two or more components are potentially in direct physical, including electrical, contact; however, "coupled" is also used generically to also mean that two or more components are not necessarily in direct contact, but nonetheless are able to cooperate and/or interact. The term coupled is also understood generically to mean indirectly connected, for example, in an appropriate context.

The terms, "and," "or," "and/or" and/or similar terms, as used herein, include a variety of meanings that also are expected to depend, at least in part, upon the particular context in which such terms are used. Typically, "or" if used to associate a list, such as A, B, or C, is intended to mean A, B, and C, here used in the inclusive sense, as well as A, B, or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular aspects of the present disclosure describe methods and/or processes for preparing and/or fabricating correlated electron materials (CEMs) to form a correlated electron switch, for example, such as may be utilized to form a correlated electron random access memory (CERAM) in memory and/or logic devices, for example. Correlated electron materials, which may form CERAM devices, and CEM switches, for example, may also be utilized in a wide range of other electronic circuit types, such as, for example, memory controllers, memory arrays, filter circuits, data converters, phase locked loop circuits, microwave and millimeter wave transceivers, and so forth, although the scope of claimed subject matter is not limited in scope in these respects. In this context, a CEM switch may exhibit a substantially rapid conductor/insulator transition, which may be brought about by electron correlations rather than solid state structural phase changes, such as changing from a crystalline to an amorphous state, for example, in a phase change memory device or, in another example, formation of filaments in resistive RAM devices. In one aspect, a substantially rapid conductor/insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/ or may at times be referred to as a relatively "insulative/ higher impedance state."

In an aspect, a quantum mechanical transition of a correlated electron material between a relatively insulative/ higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/ higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, one or more transition metal oxides (TMOs), one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a CEM device may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to an anion, such as oxygen or other types of ligands), or combinations thereof, although claimed subject matter is not limited in scope in this respect.

FIG. 1A is a diagram showing an example current density versus voltage profile of a device formed from a CEM according to an embodiment 100. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may place the CEM device into a relatively low-impedance memory state. Conversely, application of a voltage $V_{reset}$ and a current density $J_{reset}$ may place the CEM device into a relatively high-impedance memory state. As shown in FIG. 1A, reference designator 110 illustrates the voltage range that may separate $V_{set}$ from $V_{reset}$. Following placement of the CEM device into an high-impedance state or low-impedance state, the particular state of the CEM device may be detected by application of a voltage $V_{read}$ (e.g., during a read operation) and detection of a current or current density at terminals of the CEM device.

According to an embodiment, the CEM device of FIG. 1A may include any transition metal compound or transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, the CEM device of FIG. 1A may comprise materials that are transition metal oxide variable impedance materials, though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, which may establish and/or stabilize variable impedance properties. In particular, NiO variable impedance materials disclosed herein may include a carbon-containing ligand such as carbonyl (CO), forming NiO:CO. In another particular example, NiO doped with extrinsic ligands may be expressed as Ni:$L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. Other dopant ligands in addition to carbonyl include: nitrosyl (NO), ammonia (NH$_3$), Fluoride (F), Chloride (Cl), Bromide (Br), cyanide (CN), and others.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a substantially dissimilar and relatively high-impedance state responsive to a Mott transition. This may correspond to point 108 of the voltage versus current density profile of FIG. 1A. At, or suitably nearby this point, electrons are no longer screened and become localized near the metal ion. This correlation may result in a strong electron-electron interaction potential which splits the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. If a threshold current of electrons is injected and a threshold potential is applied across terminals to place the CEM device into a "set" state, a massive influx of electrons both captures holes and screens the metal ion, which may operate to collapse the band-splitting potential, thereby bringing about a relatively low-impedance state.

According to an embodiment, current in a CEM device may be controlled by an externally applied "compliance" condition determined based, at least in part, on an external current, which may be limited during a write operation, for example, to place the CEM device into a relatively high-impedance state. This externally applied compliance current may also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively low-impedance state, may determine a compliance condition for placing the CEM device into a high-impedance state in a subsequent write operation. As shown in FIG. 1A, the CEM device may be subsequently placed into a high-impedance state by application of a current density $J_{reset} \geq J_{comp}$ at a voltage $V_{reset}$ at point 108, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may occur at condition in a CEM device in which a concentration of electrons n equals, or becomes at least comparable to, a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

In expression 1, $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

Where: $A_{CEM}$ is a cross-sectional area of a CEM device; and $J_{reset}(V_{MI})$ is a current density through the CEM device to be applied to the CEM device at a threshold voltage $V_{MI}$ to place the CEM device in a relatively high-impedance state.

Figure 1B:
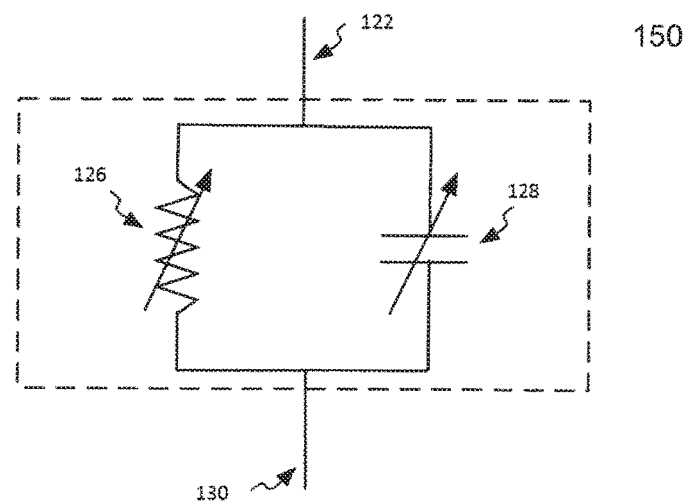
FIG. 1B is a schematic diagram of an equivalent circuit of a correlated electron material switch according to an embodiment.

FIG. 1B depicts a schematic diagram of an equivalent circuit of an example CEM switch device according to an embodiment 150. As mentioned, a correlated electron device, such as a CEM switch, a CERAM array, or other type of device utilizing one or more correlated electron materials may comprise variable impedance device exhibiting characteristics of both variable resistance and variable capacitance. In other words, impedance characteristics for a CEM variable impedance device, such as the device according to embodiment 150, may depend at least in part on resistance and capacitance characteristics of the device if measured across device terminals 122 and 130, for example. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1A as comprising discrete components, a variable impedance device, such as device of embodiment 150, may comprise a substantially homogenous CEM and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In an embodiment, example truth table 1 shows that a resistance of a variable impedance device, such as the device of embodiment 150, may transition between a low-impedance state and a substantially dissimilar high-impedance state as a function, at least in part, of a voltage applied across the CEM device. In an embodiment, an impedance exhibited at a low-impedance state may be approximately in the range of 10.0-100,000.0 times lower than a substantially dissimilar impedance exhibited in a high-impedance state. In other embodiments, and impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Truth Table 1 shows that a capacitance of a variable impedance device, such as the device of embodiment 150, may transition between a lower capacitance state, which, in an example embodiment, may comprise approximately zero, or very little, capacitance, and a higher capacitance state that is a function, at least in part, of a voltage applied across the CEM device.

According to an embodiment, a CEM device, which may include a CEM switch, a CERAM memory device, or a variety of other electronic devices comprising a correlated electron material, may be placed into a relatively low-impedance memory state, such as by transitioning from a relatively high-impedance state, for example, via injection of a sufficient number of electrons to satisfy a Mott transition criteria. In transitioning a CEM device to a relatively low-impedance state, as enough electrons have been injected and the potential across terminal of the CEM device overcomes a threshold switching potential (e.g., $V_{set}$), injected electrons begin to screen and unlocalize double-occupied electrons to close the bandgap.

In particular embodiments, changes in impedance states of CEM devices, such as from a low-impedance state to a substantially dissimilar high-impedance state, for example, may be brought about by the "back-donation" of electrons of compounds comprising $Ni_x:O_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of a lattice structure, for example, comprising the transition metal, transition metal oxide, or combination thereof. Back-donation permits a transition metal, transition metal oxide, or combination thereof, to maintain an ionization state that is favorable to electrical conduction under the influence of an applied voltage. In certain embodiments, back-donation in a correlated electron material, for example, may occur responsive to use of a dopant, such as carbonyl (CO), controllably and reversibly "donate" electrons to a conduction band of the transition metal or transition metal oxide, such as nickel, for example, during operation. Back-donation may be reversed, in a nickel oxide material, for example, (e.g., NiO:CO), which may thereby permit the nickel oxide material to switch to exhibiting a high-impedance property during device operation. Thus, in this context, a back-donating material refers to a material that exhibits an impedance switching property, such as switching from a first impedance state to a substantially dissimilar second impedance state (e.g., from a relatively low impedance state a relatively high impedance state, or vice versa) based, at least in part, on influence of an applied voltage to control donation of electrons, and reversal of the electron donation, to and from a conduction band of the material.

In some embodiments, by way of back-donation, a CEM switch comprising a transition metal or a transition metal oxide, may exhibit low-impedance properties if the transition metal, such as nickel, for example, is placed into an oxidation state of 2+ (e.g., $Ni^{2+}$ in a material, such as NiO:CO). Conversely, electron back-donation may be reversed if the transition metal, such as nickel, for example, is placed into an oxidation state of either 1+ or 3+. Accordingly, back-donation may result in "disproportionation," which may comprise substantially simultaneous oxidation and reduction reaction, such as:

$$2Ni^{2+} \rightarrow Ni^{1+} + Ni^{3+} \qquad (4)$$

In which such disproportionation, in this instance refers to formation of nickel ions as $Ni^{1+} + Ni^{3+}$ as shown in expression (4), which may bring about, for example, a relatively high-impedance state during operation of the CEM device. In an embodiment, a carbon-containing ligand, such as a carbonyl molecule (CO), may permit sharing of electrons during operation of the CEM device so as to permit the disproportionation reaction and its reversal, such as:

$$Ni^{1+} + Ni^{3+} \rightarrow 2Ni^{2+} \qquad (5)$$

As previously mentioned, reversal of the disproportionation reaction, as shown in expression (5), permits nickel-based CEM to return to a relatively low-impedance state In embodiments, depending on an atomic concentration of NiO:CO, which may vary from values approximately in the range of an atomic percentage of 0.1% to 10.0%, $V_{reset}$ and $V_{set}$ as shown in FIG. 1A, may vary approximately in the range of 0.1 V to 10.0 V subject to the condition that $V_{set} > V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of NiO:CO and other present in the CEM device, as well as other process variations, and claimed subject matter is not limited in this respect.

In certain embodiments, atomic layer deposition may be utilized to form films comprising nickel oxide materials, such as NiO:CO, to permit electron back-donation during operation of the device in a circuit environment, for example, to give rise to a low-impedance state. Also during operation in a circuit environment, for example, electron back-donation may be reversed so as to give rise to a high-impedance state, for example. In particular embodiments, atomic layer deposition may utilize two or more "precursor" sources to deposit components of, for example, NiO:CO, or other transition metal oxide, transition metal compounds, or combinations thereof, onto a conductive substrate. In an embodiment, layers of a CEM device may be deposited utilizing separate molecules, AX and BY, according to expression (6), below:

$$AX_{(gas)} + BY_{(gas)} = AB_{(solid)} + XY_{(gas)} \qquad (6)$$

Wherein "A" of expression (6) corresponds to a transition metal, transition metal oxide, or any combination thereof. In embodiments, a transition metal oxide may comprise nickel, but may comprise other transition metals and/or transition metal oxides, such as aluminum, cadmium, chromium, cobalt, copper, gold, iron, manganese, mercury, molybdenum, nickel palladium, rhenium, ruthenium, silver, tin, titanium, vanadium.

In particular embodiments, CEM compounds that comprise more than one transition metal oxide may also be utilized, such as yttrium titanate ($YTiO_3$). "X" of expression (6) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-amino-pent-2-en-4-onato $(apo)_2$, $(dmamb)_2$ where dmamb=1-dimethylamino-2-methyl-2-butanolate, (dmamp)2 where dmamp=1-dimethylamino-2-methyl-2-propanolate, Bis(pentamethylcyclopentadienyl) $(C_5(CH_3)_5)_2$ and carbonyl $(CO)_4$. Accordingly, in some embodiments, nickel-based precursors AX may comprise, for example, nickel amidinates (Ni(AMD)) an example of which is $Ni(MeC(NBu)_2)_2$, nickel dicyclopentadienyl $(Ni(Cp)_2)$, nickel diethylcyclopentadienyl (Ni$(EtCp)_2$), Bis(2,2,6,6-tetramethylheptane-3,5-dionato)Ni(II) $(Ni(thd)_2)$, nickel acetylacetonate $(Ni(acac)_2)$, bis(methylcyclopentadienyl)nickel $(Ni(CH_3C_5H4)_2$, Nickel dimethylglyoximate $(Ni(dmg)_2)$, Nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, Bis(pentamethylcyclopentadienyl) nickel $(Ni(C_5(CH_3)_5)_2$, and nickel carbonyl $(Ni(CO)_4)$, just to name a few examples.

In expression (6), "BY" may comprise an oxidizer, such as oxygen ($O_2$), ozone ($O_3$), nitric oxide (NO), hydrogen peroxide ($H_2O_2$), just to name a few examples. In embodiments, the AX compound may comprise a transition metal oxide or a transition metal compound. BY may comprise a species chosen such that the reaction shown of expression (6) may form AB, wherein AB represents the CEM formed by the process. In other embodiments, plasma may be used with an oxidizer to form oxygen radicals or other activated species to form the CEM. In other embodiments, the CEM may be formed by chemical vapor deposition of any type or by sputter deposition or by physical vapor deposition. Therefore, in some embodiments, the X and/or Y may not be required to form AB (such as in the case of sputtering from a target of AB or co sputtering from a target of A and a target of B, or sputtering from a target of A in an ambient environment comprising B. It should be noted that concentrations, such as atomic concentration, of precursor, such as AX and BY may be adjusted so as to bring about a final atomic concentration of carbon, such as in the form of carbonyl, of between approximately 0.1% and 10.0%. However, claimed subject matter is not necessarily limited to the above-identified precursors and/or concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition or the like, utilized in fabrication of CEM devices.

In particular embodiments, such as embodiments utilizing atomic layer deposition, a substrate may be exposed to precursors in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:CO is performed, temperature ranges approximately in the range of 20.0° C. and 400.0° C. may be utilized. After exposure to precursor sources, such sources may be purged from the heated chamber, wherein purging may occur over durations approximately in the range of 0.5 seconds to 180.0 seconds. It should be noted, however, that these are merely examples of potentially suitable temperatures and exposure times, and claimed subject matter is not limited in this respect.

In certain embodiments, a single two-precursor cycle utilizing atomic layer deposition may bring about a CEM device layer comprising a thickness approximately in the range of 0.6 Å to 1.5 Å. Accordingly, in an embodiment, to form a CEM device film comprising a thickness of approximately 500 Å utilizing an atomic layer deposition process in which layers comprise a thickness of approximately 0.6 Å, 800-900 two-precursor cycles, such as AX+BY of equation (6), for example, may be utilized. In another embodiment, utilizing an atomic layer deposition process in which layers comprise approximately 1.5 Å, 300 to 350 two-precursor cycles, such as AX+BY, for example, may be utilized. It should be noted that atomic layer deposition may be utilized to form CEM device films having other thicknesses, such as thicknesses approximately in the range of 1.5 nm and 150.0 nm, for example, and claimed subject matter is not limited in this respect.

In particular embodiments, responsive to one or more two-precursor cycles of atomic layer deposition, a CEM device film may undergo in situ annealing, which may permit an improvement of film properties such as a more uniform distribution of carbon, such as in the form of carbonyl, throughout the CEM device film. In certain embodiments, a chamber may be heated to a temperature approximately in the range of 20.0° C. to 1000.0° C. However, in other embodiments, in situ annealing may be performed utilizing temperatures approximately in the range of 150.0° C. to 800.0° C. In situ annealing times may vary from a duration approximately in the range of 1 seconds to 5.0 hours. In particular embodiments, annealing times may vary within more narrow ranges, such as, for example, from approximately 0.5 minutes to approximately 180.0 minutes, for example, and claimed subject matter is not limited in these respects.

Figure 2A:
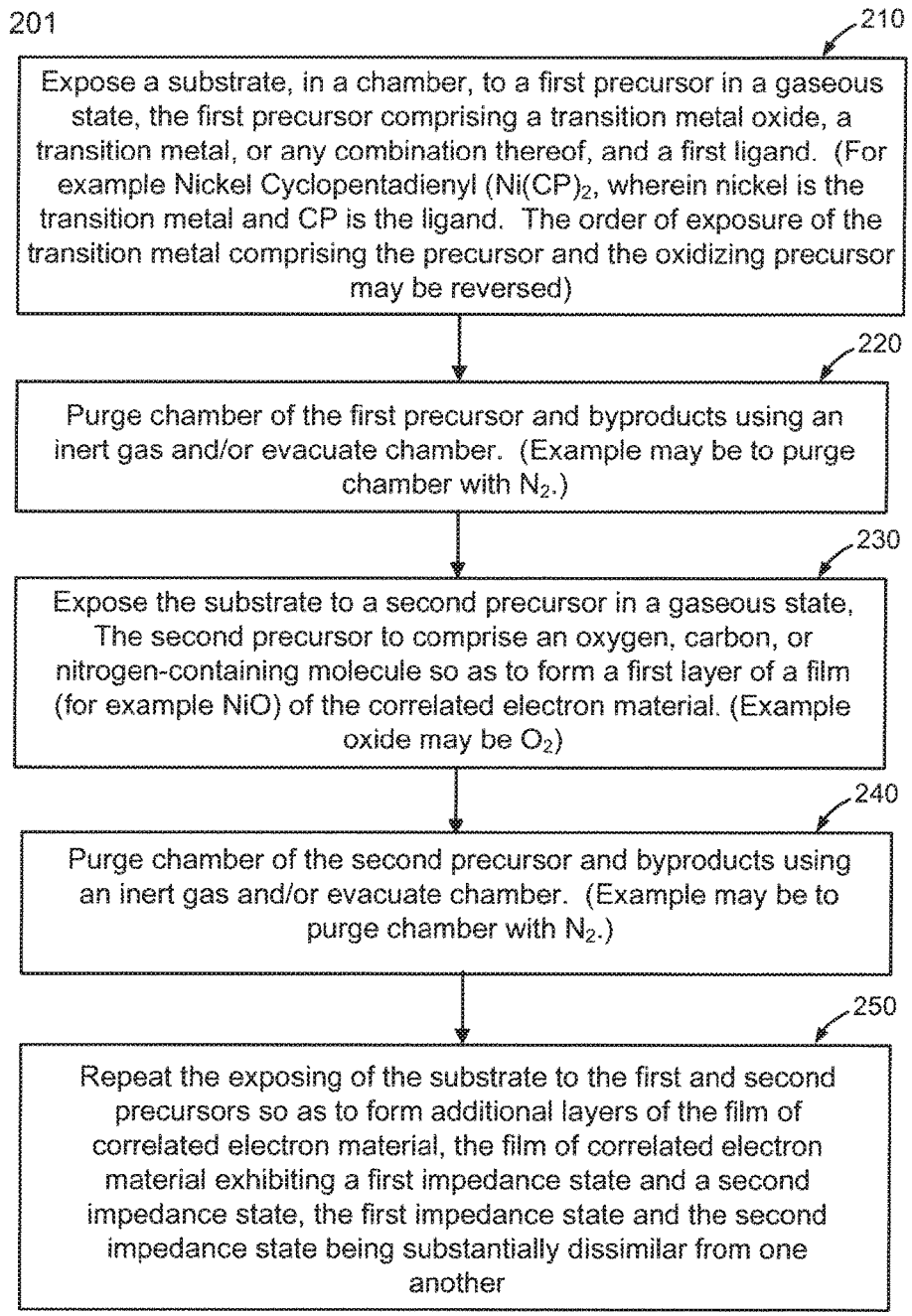

FIG. 2A shows a simplified flowchart for a method for fabricating correlated electron device materials according to an embodiment 201. Example implementations, such as described in FIGS. 2A, 2B, and 2C, for example, may include blocks in addition to those shown and described, fewer blocks, or blocks occurring in an order different than may be identified, or any combination thereof. In an embodiment, a method may include blocks 210, 230, and 250, for example. The method of FIG. 2A may accord with the general description of atomic layer deposition previously described herein. The method of FIG. 2A may begin at block 210, which may comprise exposing the substrate, in a heated chamber, for example, to a first precursor in a gaseous state (e.g., "AX"), wherein the first precursor comprises a transition metal oxide, a transition metal, a transition metal compound or any combination thereof and a first ligand. The method may continue at block 220, which may comprise removing the precursor AX and byproducts of AX by using an inert gas or evacuation or combination. The method may continue at block 230, which may comprise exposing the substrate to a second precursor (e.g., BY) in a gaseous state, wherein the second precursor comprises a oxide so as to form a first layer of the film of a CEM device. The method may continue at block 240, which may comprise removing the precursor BY and byproducts of BY through the use of an inert gas or evacuation or combination. The method may continue at block 250, which may comprise repeating the exposing of the substrate to the first and second precursors with intermediate purge and/or evacuation steps so as to form additional layers of the film until the correlated electron material is capable of exhibiting a ratio of first to second impedance states of at least 5.0:1.0.

FIG. 2B shows a simplified flowchart for a method for fabricating correlated electron device materials according to an embodiment 202. The method of FIG. 2B may accord with the general description of chemical vapor deposition or CVD or variations of CVD such as plasma enhanced CVD and others. In FIG. 2B, such as at block 260, a substrate may be exposed to precursor AX and BY simultaneously under conditions of pressure and temperature to promote the formation of AB, which corresponds to a CEM. Additional approaches may be employed to bring about formation of a CEM, such as application of direct or remote plasma, use of hot wire to partially decompose precursors, or lasers to enhance reactions as examples of forms of CVD. The CVD film processes and/or variations, may for a duration and under conditions as can be determined by one skilled in the art of CVD until, for example, correlated electron material having appropriate thickness and exhibiting appropriate properties, such as electrical properties, such as a ratio of first to second impedance states of at least 5.0:1.0.

FIG. 2C shows a simplified flowchart for a method for fabricating correlated electron device materials according to an embodiment 203. The method of FIG. 2C may accord with the general description of physical vapor deposition or PVD or Sputter Vapor Deposition or variations of these and/or related methods. In FIG. 2C a substrate may be exposed in a chamber, for example, to an impinging stream of precursor having a "line of sight" under particular conditions of temperature and pressure to promote formation of a CEM comprising material AB. The source of the precursor may be, for example, AB or A and B from separate "targets" wherein deposition is brought about using a stream of atoms or molecules that are physically or thermally or by other means removed (sputtered) from a target comprised of material A or B or AB and are in "line of sight" of the substrate. In an implementation, a process chamber may be utilized wherein pressure within the process chamber pressure comprises a value low enough, such as a pressure value that approaches a lower threshold, or a pressure value lower than a threshold, such that the mean free path of the atoms or molecules or A or B or AB is approximately or more than the distance from the target to the substrate. The stream of AB (or A or B) or both may combine to form AB on the substrate due to conditions of the reaction chamber pressure, temperature of the substrate and other properties that are controlled by one skilled in the art of PVD and sputter deposition. In other embodiments of PVD or sputter deposition, the ambient environment may be a source such as BY or for example an ambient of $O_2$ for the reaction of sputtered nickel to form NiO doped with carbon or CO, for example co-sputtered carbon. The PVD film and its variations will continue for a time required and under conditions as can be determined by one skilled in the art of PVD until correlated electron material of thickness and properties is deposited that is capable of exhibiting a ratio of first to second impedance states of at least 5.0:1.0.

The method may continue at block 272 in which, at least some embodiments, a metal, such as nickel, may be sputtered from a target and a transition metal oxide may be formed in a subsequent oxidation process. The method may continue at block 273 in which, at least in some embodiments, a metal or metal oxide may be sputtered in a chamber comprising gaseous carbon with or without a substantial portion of oxygen.

Figure 3:
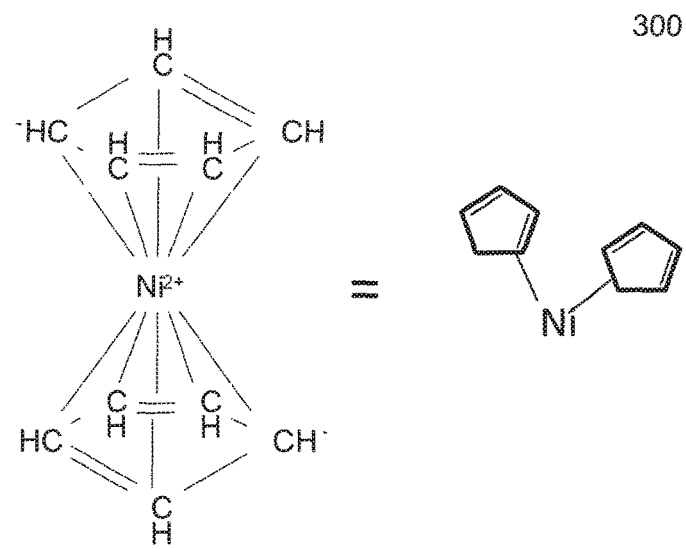
FIG. 3 is a diagram of a Bis(cyclopentadienyl) molecule ($Ni(C_5H_5)_2)_2$), which may function as an example precursor, in a gaseous form, utilized in fabrication of correlated electron material devices according to an embodiment.

FIG. 3 is a diagram of a nickel dicyclopentadienyl molecule ($Ni(C_5H_5)_2$), which may be abbreviated as $Ni(Cp)_2$, may function as a precursor, in a gaseous form, utilized in fabrication of correlated electron materials according to an embodiment 300. As shown in FIG. 3, a nickel atom, near the center of the nickel dicyclopentadienyl molecule, has been placed in an ionization state of ±2 to form an $N^{2+}$ ion. In the example molecule of FIG. 3, an additional electron is present in the upper left and lower right $CH^-$ sites of the cyclopentadienyl (Cp) portions of the dicyclopentadienyl ($(Cp)_2$) molecule. FIG. 3 additionally illustrates a shorthand notation showing nickel bonded to pentagon-shaped monomers of a dicyclopentadienyl molecule.

FIGS. 4A-4D show sub-processes utilized in a method for fabricating a film comprising a CEM according to an embodiment. The sub-processes of FIGS. 4A-4D may correspond to the atomic layer deposition process utilizing precursors AX and BY of expression (6) to deposit components of NiO:CO onto a conductive substrate. In embodiments, a conductive substrate may comprise an electrode material comprising titanium nitride, platinum, titanium, copper, aluminum, cobalt, nickel, tungsten, tungsten nitride, cobalt silicide, ruthenium oxide, chromium, gold, palladium, indium tin oxide, tantalum, silver, iridium, or any combination thereof. However, the sub-processes of FIGS. 4A-4D may be utilized, with appropriate material substitutions, to fabricate films comprising CEM that utilize other transition metals, transition metal oxides, transition metal compounds or combinations thereof, and claimed subject matter is not limited in this respect.

Figure 4A:
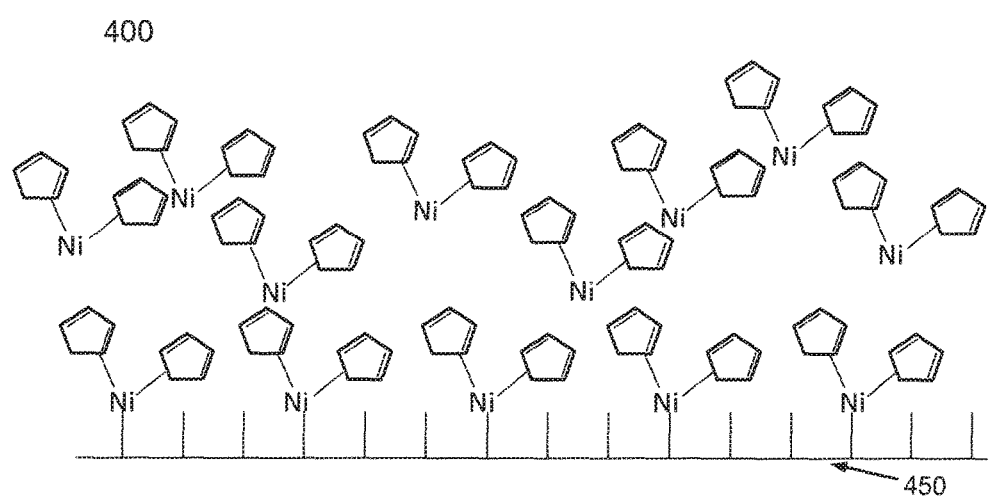
FIGS. 4A-4D show sub-processes utilized in a method for fabricating correlated electron material devices according to an embodiment.

As shown in FIG. 4A, (embodiment 400) a substrate, such as substrate 450, may be exposed to a first gaseous precursor, such as precursor AX of expression (6), such as a gaseous precursor comprising nickel dicyclopentadienyl (Ni $(Cp)_2$) for a duration of approximately in the range of 0.5 seconds to 180.0 seconds. As previously described, concentration, such as atomic concentration, of a first gaseous precursor, as well as exposure time, may be adjusted so as to bring about a final atomic concentration of carbon, such as in the form of carbonyl, of between approximately 0.1% and 10.0%, for example. As shown in FIG. 4A, exposure of a substrate to gaseous ($Ni(Cp)_2$ may result in attachment of ($Ni(Cp)_2$) molecules or (Ni(Cp)) at various locations of the surface of substrate 450. Deposition may take place in a heated chamber which may attain, for example, a temperature approximately in the range of 20.0° C. to 400.0° C. However, it should be noted that additional temperature ranges, such as temperature ranges comprising less than approximately 20.0° C. and greater than approximately 400.0° C. are possible, and claimed subject matter is not limited in this respect.

Figure 4B:
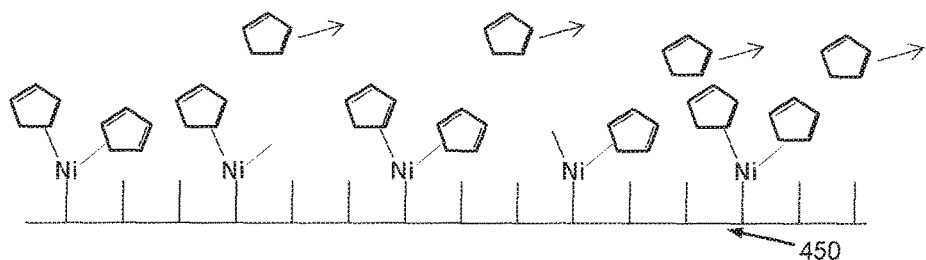

As shown in FIG. 4B, (embodiment 410) after exposure of a conductive substrate, such as conductive substrate 450, to a gaseous precursor, such as a gaseous precursor comprising ($Ni(Cp)_2$), the chamber may be purged of remaining gaseous $Ni(Cp)_2$ and/or Cp ligands. In an embodiment, for the example of a gaseous precursor comprising ($Ni(Cp)_2$), the chamber may be purged for duration approximately in the range of 0.5 seconds to 180.0 seconds. In one or more embodiments, a purge duration may depend, for example, on affinity (aside from chemical bonding) of unreacted ligands and byproducts with a transition metal, transition metal compounds, transition metal oxide, or the like surface as well as other surfaces present in the process chamber. Thus, for the example of FIG. 4B, if unreacted $Ni(Cp)_2$, Ni(Cp), Ni, and other byproducts were to exhibit an increased affinity for the surfaces of the substrate or chamber, a larger purge duration may be utilized to remove remaining gaseous ligands, such as those mentioned. In other embodiments, purge duration may depend, for example, on gas flow within the chamber. For example, gas flow within a chamber that is predominantly laminar may permit removal of remaining gaseous ligands at a faster rate, while gas flow within a chamber that is predominantly turbulent may permit removal of remaining ligands at a slower rate. It should be noted that claimed subject matter is intended to embrace purging of remaining gaseous material without regard to flow characteristics within a chamber.

Figure 4C:
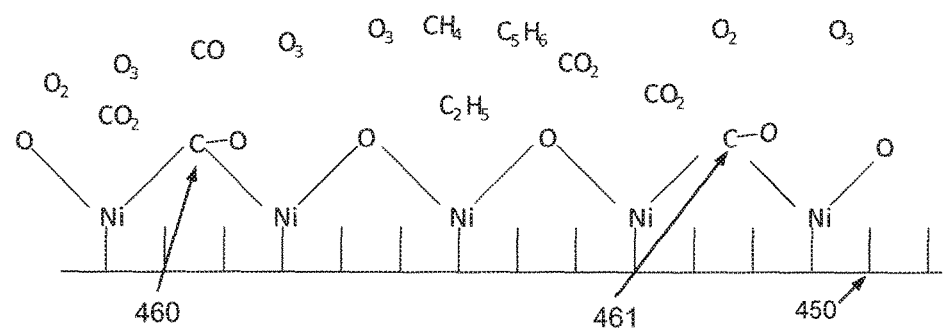

As shown in FIG. 4C, (embodiment 420) a second gaseous precursor, such as precursor BY of expression (6), may be introduced into the chamber. As previously mentioned, a second gaseous precursor may comprise an oxidizer, which may operate to displace a first ligand, such as $(Cp)_2$, for example, and replace the ligand with an oxidizer, such as oxygen ($O_2$), ozone ($O_3$), nitric oxide (NO), hydrogen peroxide ($H_2O_2$), just to name a few examples. Accordingly, as shown in FIG. 4C, oxygen atoms may form bonds with at least some nickel atoms bonded to substrate 450. In an embodiment, precursor BY may oxidize ($Ni(Cp)_2$) to form a number of additional oxidizers, and/or combinations thereof, in accordance with expression (7) below:

$$Ni(C_5H_5)_2 + O_3 \rightarrow NiO + \text{potential byproducts (e.g., CO,} \\ CO_2, C_5H_5, C_5H_6, CH_3, CH_4, O_2H_5, \\ C_2H_6, \ldots) \quad (7)$$

Wherein $C_5H_5$ has been substituted for Cp in expression (7). As shown in FIG. 4C, a number of potential byproducts are shown, including $C_2H_5$, $CO_2$, $CH_4$, and $C_5H_6$. As is also shown in FIG. 4C, carbonyl (CO) molecules may bond to nickel oxide complexes, such as at sites 460 in 461, for example. In embodiments, such nickel-to-carbonyl bonds (e.g. NiO:CO), in an atomic concentration of between, for example, 0.1% and 10.0%, may bring about the substantially rapid conductor/insulator transition of a CEM device.

Figure 4D:
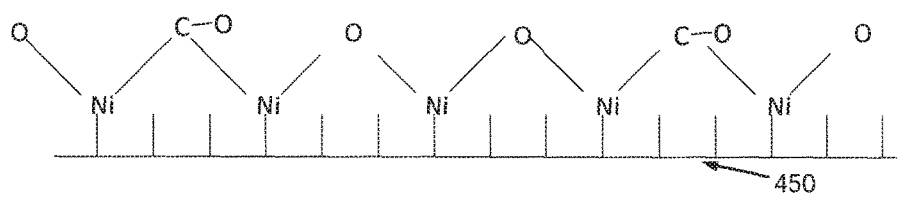

As shown in FIG. 4D, (embodiment 430) potential hydrocarbon byproducts, such as CO, $CO_2$, $C_5H_5$, $C_5H_6$, $CH_4$, $C_2H_5$, $C_2H_6$, for example, may be purged from the chamber. In particular embodiments, such purging of the chamber may occur for a duration approximately in the range of 0.5 seconds to 180.0 seconds utilizing a pressure approximately in the range of 0.01 Pa to 105.0 kPa.

In particular embodiments, the sub-processes described shown in FIGS. 4A-4D may be repeated until a desired thickness, such as a thickness approximately in the range of 1.5 nm to 100.0 nm, is achieved. As previously mentioned herein, atomic layer deposition approaches, such as shown and described with reference to FIGS. 4A-4D, for example, may give rise to a CEM device film having a thickness approximately in the range of 0.6 Å to 1.5 Å for one ALD cycle, for example. Accordingly, to construct a CEM device film comprising a thickness of 500.0 Å (50.0 nm), just as a possible example, approximately 300 to 900 two-precursor cycles, utilizing AX+BY for example, may be performed. In certain embodiments, cycles may be occasionally interspersed among differing transition metals, and/or transition metal compounds and/or transition metal oxides to obtain desired properties. For example, in an embodiment, two atomic layer deposition cycles, in which layers of NiO:CO may be formed, may be followed by three atomic layer deposition cycles to form, for example, titanium oxide carbonyl complexes (TiO:CO). Other interspersing of transition metals, and/or transition metal compounds and/or transition metal oxides is possible, and claimed subject matter is not limited in this respect.

In particular embodiments, after the completion of one or more atomic layer deposition cycles, a substrate may be annealed, which may assist in controlling grain structure, densifying the CEM film or otherwise improving the film properties, performance or endurance. For example, if atomic layer deposition produces the number of columnar shaped grains, annealing may permit boundaries of columnar-shaped grains to grow together which may, for example, reduce resistance variations of the CEM device, for example. Annealing may give rise to additional benefits, such as more evenly distributing of carbon molecules, such as carbonyl; for example, throughout the CEM device material, and claimed subject matter is not limited in this respect.

Figure 5A:
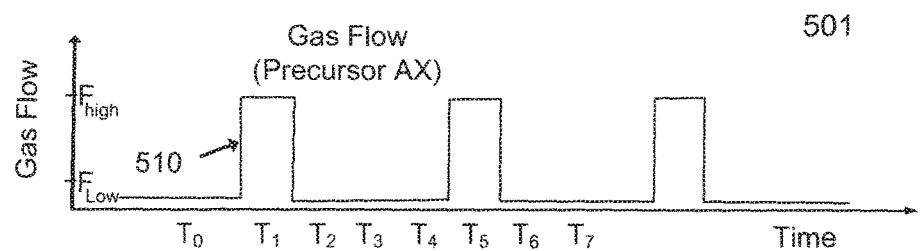
FIGS. 5A-5D are diagrams showing gas flow and temperature profiles, as a function of time, which may be used in a method for fabricating correlated electron material devices according to an embodiment.
Figure 5B:
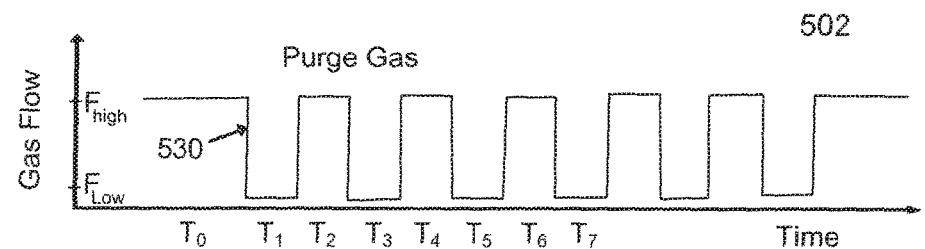

FIGS. 5A-5D are diagrams showing precursor flow and temperature profiles, as a function of time, which may be used in a method for fabricating correlated electron device materials according to an embodiment. A common timescale ($T_0$-$T_7$) is utilized for FIGS. 5A-5D. FIG. 5A shows a precursor flow profile 510 for a precursor (e.g., AX), according to an embodiment 501. As shown in FIG. 5B, precursor gas flow may be increased, so as to permit the precursor gas to enter a chamber which a CEM device is undergoing fabrication. Thus, in accordance with precursor gas flow profile 510, at time $T_0$, precursor AX gas flow may be approximately 0.0 (e.g. negligible). At time $T_1$, precursor AX gas flow may be increased to relatively higher value. At time $T_2$, which may correspond to a time approximately the range of 0.5 seconds to 180.0 seconds after time $T_1$, precursor AX gas may be purged and/or evacuated from the chamber, such as by purging, for example. Precursor AX gas flow may be stopped until approximately time $T_5$, at which time precursor AX gas flow may be increased to a relatively higher value. After time $T_5$, such as at times $T_6$ and $T_7$ precursor AX gas flow may be returned to 0.0 (e.g. negligible amount) until increased at a later time.

FIG. 5B shows a gas flow profile 520 for a purge gas, according to an embodiment 502. As shown in FIG. 5B, purge gas flow may be increased and decreased so as to permit evacuation of the fabrication chamber of precursor gases AX and BY, for example. At time $T_0$, purge gas profile 520 indicates a relatively high purge gas flow, which may permit removal of impurity gases within the fabrication chamber prior to time $T_1$. At time $T_1$, purge gas flow may be reduced to approximately 0.0, which may permit introduction of precursor AX gas into the fabrication chamber. At time $T_2$, purge gas flow may be increased for duration of approximately in the range of 0.5 seconds to 180.0 seconds so as to permit removal of excess precursor gas AY and reaction byproducts from the fabrication chamber.

Figure 5C:
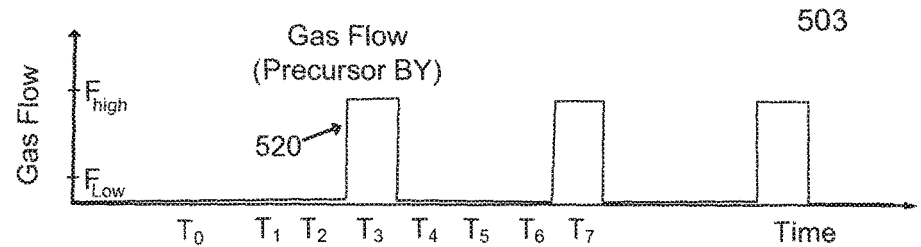

FIG. 5C shows a gas flow profile 520 for a precursor gas (e.g., BY), according to an embodiment 503. As shown in FIG. 5C, precursor BY gas flow may remain at a flow of approximately 0.0, until approximately time $T_3$, at which gas flow may be increased to relatively higher value. At time $T_4$, which may correspond to a time approximately in the range of 0.5 seconds to 180.0 seconds after time $T_2$, precursor BY gas may be purged and/or evacuated from the chamber, such as by purging, for example. Precursor BY gas flow may be returned to 0.0, until approximately time $T_7$, at which tune precursor BY gas flow may be increased to a relatively higher value.

At time $T_3$, purge gas flow may be decreased to relatively low value, which may permit precursor BY gas to enter the fabrication chamber. After exposure of the substrate to precursor BY gas, purge gas flow may again be increased so as to permit removal of the fabrication chamber of precursor BY gas, which may signify completion of a single atomic layer of a CEM device film, for example. After removal of precursor BY gas, precursor AX gas may be reintroduced to the fabrication chamber so as to initiate a deposition cycle of a second atomic layer of a CEM device film. In particular embodiments, the above-described process of introduction of precursor AX gas into the fabrication chamber, purging of remaining precursor AX gas from the fabrication chamber, introduction of precursor BY gas, and purging of remaining precursor BY gas, may be repeated, for example, approximately in the range of 300 times to 900 times, for example. Repetition of the above-described process may bring about CEM device films having a thickness dimension of, for example, between approximately 20.0 nm and 100.0 nm, for example.

Figure 5D:
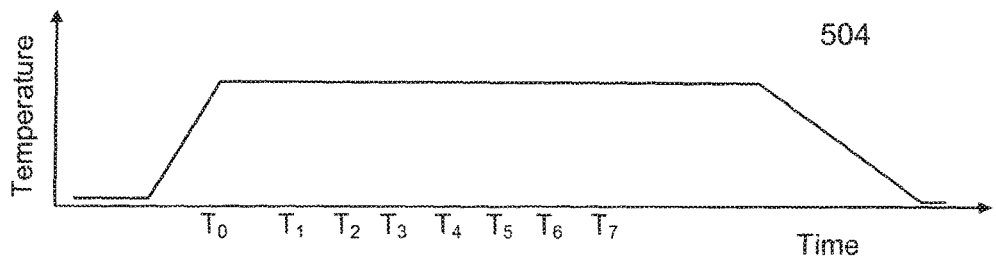
Figure 5E:
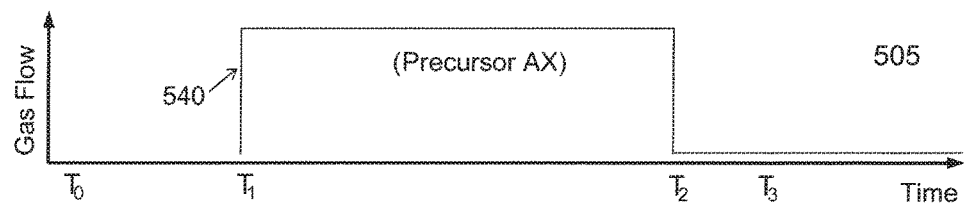
FIGS. 5E-5H are diagrams showing precursor flow and temperature profiles, as a function of time, which may be used in a method for fabricating correlated electron device materials according to an embodiment.
Figure 5F:
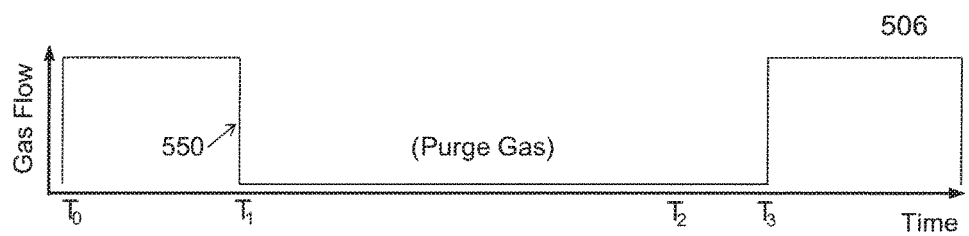
Figure 5G:
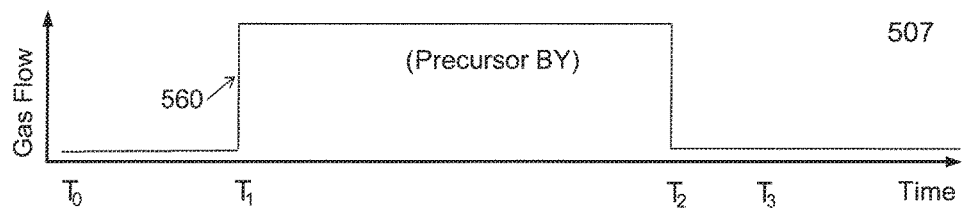

FIG. 5D is a diagram showing a temperature profile, as a function of time, used in a method for fabricating correlated electron device materials according to an embodiment. In FIG. 5D, a deposition temperature may be raised to attain a temperature of, for example, a temperature approximately in the range of 20.0° C. to 900.0° C. However, in particular embodiments, somewhat smaller ranges may be utilized, such as temperature ranges approximately in the range of 100.0° C. to 800.0° C. Further, for particular materials, even smaller temperature ranges may be utilized, such as from approximately 100.0° C. to approximately 600.0° C.

Figure 5H:
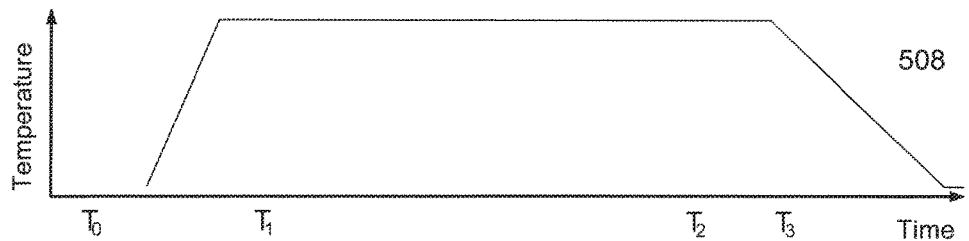

FIGS. 5E-5H are diagrams showing precursor flow and temperature profiles, as a function of time, which may be used in a method for fabricating correlated electron device materials according to an embodiment. A common timescale ($T_0$-$T_3$) is utilized for FIGS. 5E-5H. As shown in 505, precursor AX may be brought into a fabrication chamber at time $T_1$, where time $T_0$ to time $T_1$ is used to purge and/or evacuate the process chamber in preparation for the deposition by an increase in purge gas flow such as shown in embodiment 550. Embodiment 540 shows a relative increase in flow of precursor AX occurs at time $T_1$. Also at time $T_1$, a second reactant precursor, BY, flow may be increased as shown in embodiment 507 with gas flow increase at 560. The two precursors (AX and BY) may flow substantially at the same time for the amount of time required for the thickness of the CEM film. The temperature profile shown in FIG. 5H shows the temperature for deposition is set before or near the time, $T_0$.

Figure 6A:
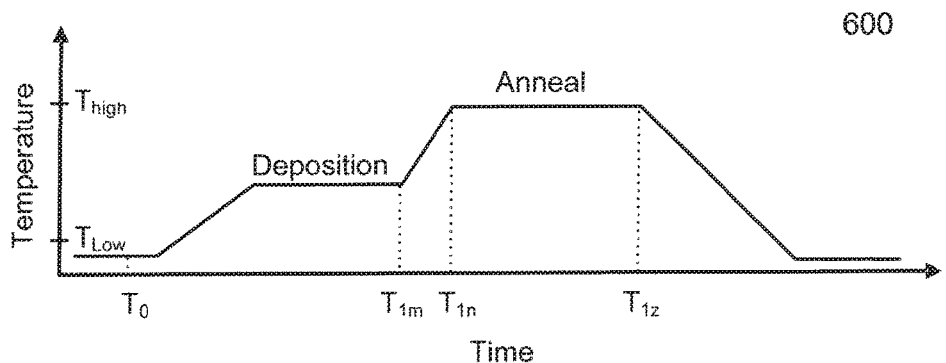
FIGS. 6A-6C are diagrams showing temperature profiles, as a function of time, used in deposition and annealing processes for fabricating correlated electron material devices according to an embodiment.
Figure 6B:
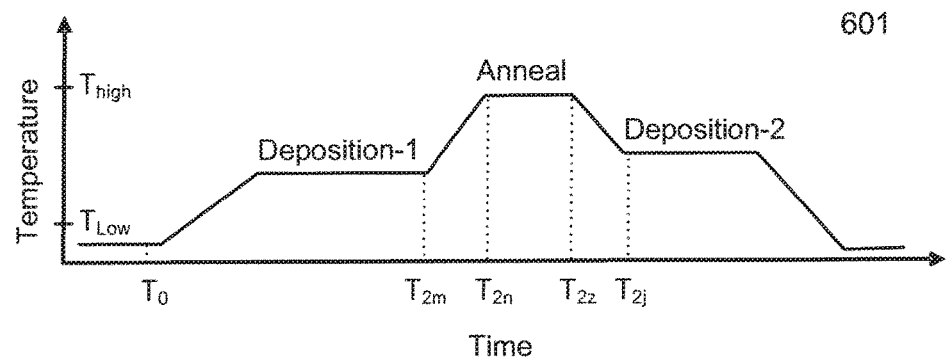
Figure 6C:
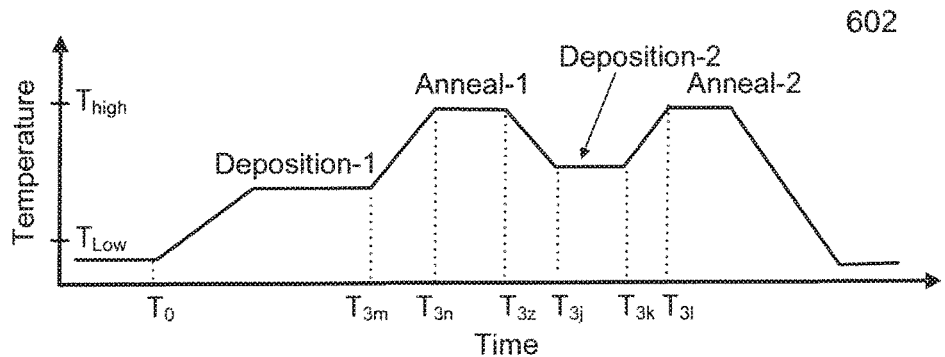

FIGS. 6A-6C are diagrams showing temperature profiles, as a function of time, used in deposition and annealing processes for fabricating CEM devices according to an embodiment. As shown in FIG. 6A (embodiment 600), deposition may take place during an initial time span, such as from $T_0$ to $T_{1m}$, during which time, a CEM device film may be deposited upon an appropriate substrate utilizing an atomic layer deposition process. After deposition of a CEM device film, an annealing period may follow. In some embodiments, a number of atomic layer deposition cycles may range from, for example, approximately 10 cycles, to as many as 1000 cycles or more, and claimed subject matter is not limited in this respect. After completion of deposition of a CEM film onto a suitable substrate, relatively high-temperature annealing or an annealing at the same temperature or lower temperature than the deposition temperature may be performed utilizing a temperature approximately in the range of 20.0° C. to 900.0° C., such as from time $T_{1n}$ to time $T_{1z}$. However, in particular embodiments, smaller ranges may be utilized, such as temperature ranges approximately in the range of 100.0° C. to 800.0° C. Further, for particular materials, even smaller temperature ranges may be utilized, such as from approximately 200.0° C. to approximately 600.0° C. Annealing times may range from approximately 1.0 second to approximately 5.0 hours, but may be narrowed to, for example, durations of approximately 0.5 minutes to 180.0 minutes. It should be noted that claimed subject matter is not limited to any particular temperature ranges for annealing of CEM devices, nor is claimed subject matter limited to any particular durations of annealing. In other embodiments the deposition method may be chemical vapor deposition, physical vapor deposition, sputter, plasma enhanced chemical vapor deposition or other methods of deposition or combinations of deposition methods such as a combination of ALD and CVD in order to form the CEM film.

In embodiments, annealing may be performed in a gaseous environment comprising one or more of gaseous nitrogen ($N_2$), hydrogen ($H_2$), oxygen ($O_2$), water or steam ($H_2O$), nitric oxide (NO), nitrous oxide ($N_2O$), nitrogen dioxide ($NO_2$), ozone ($O_3$), argon (Ar), helium (He), ammonia ($NH_3$), carbon monoxide (CO), methane ($CH_4$), acetylene ($C_2H_2$), ethane ($C_2H_6$), propane ($C_3H_8$), ethylene ($C_2H_4$), butane ($C_4H_{10}$), or any combination thereof. Annealing may also occur in reduced pressure environments or pressures up to and excess of atmospheric pressure, including pressures of multiple atmospheres.

As shown in FIG. 6B (embodiment 601), deposition may take place during an initial time span, such as from $T_0$ to $T_{2m}$, during which between approximately 10 and approximately 500 cycles of atomic layer deposition may be performed. At time $T_{2n}$, an annealing period may be initiated and may continue until time $T_{2z}$. After time $T_{2z}$, a second set of atomic layer deposition cycles may occur, perhaps numbering between approximately 10 and approximately 500 cycles, for example. As shown in FIG. 6B, a second set of atomic layer deposition (Deposition-2) cycles may occur. In other embodiments the deposition method may be chemical vapor deposition, physical vapor deposition, sputter, plasma enhanced chemical vapor deposition or other methods of deposition or combinations of deposition methods such as a combination of ALD and CVD in order to form the CEM film.

As shown in FIG. 6C, (embodiment 602) deposition may take place during an initial time span, such as from time $T_0$ to time $T_{3m}$, during which between approximately 10 and approximately 500 cycles of atomic layer deposition may be performed. At time $T_{3n}$, a first annealing period (Anneal-1) may be initiated and may continue until time $T_{3z}$. At time $T_{3j}$ a second set of atomic layer deposition cycles (Deposition-2) may be performed until time $T_{3k}$, at which a chamber temperature may be increased so that a second annealing period (Anneal-2) may occur, such as beginning at time $T_{3l}$, for example. In other embodiments the deposition method may be chemical vapor deposition, physical vapor deposition, sputter, plasma enhanced chemical vapor deposition or other methods of deposition or combinations of deposition methods such as a combination of ALD and CVD in order to form the CEM film.

As used herein, the term "substrate" may include, bare silicon, silicon-on-insulator (SOI) or silicon-on-sapphire (SOS) technology, doped and/or undoped semiconductors, epitaxial layers of silicon supported by a base semiconductor foundation, complementary metal oxide semiconductors (CMOS), such as a CMOS front end with a metal backend, and/or other semiconductor structures and/or technologies, including CEM devices, for example. In embodiments, a substrate may comprise a group III-nitride such as aluminum nitride or gallium nitride; or group III-V materials such as gallium arsenide, indium phosphide or others; or other group IV materials such as Ge, graphene, diamond or silicon carbide or combinations thereof. A substrate may also comprise a metal film (such as titanium nitride, copper, aluminum, cobalt, nickel, or other materials); or carbon nanotubes or carbon nanotube clusters; or other conducting materials such as ruthenium oxide or other conducting oxides upon which the CEM is deposited. Various circuitry, such as driver and/or decode circuitry, for example, associated with operating a programmable memory array, for example, may be formed in and/or on a substrate. Furthermore, when reference is made to a "substrate" in the following description, previous process steps may have been utilized to form regions and/or junctions in the base semiconductor structure or foundation.

In an embodiment, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to bring about integrated circuit devices, which may include, for example, a first correlated electron device having a first correlated electron material and a second correlated electron device having a second correlated electron material, wherein the first and second correlated electron materials may comprise impedance characteristics that differ from one another. Also, in an embodiment, a first CEM device and a second CEM device, comprising impedance characteristics that differ from one another, may be formed within a particular layer of an integrated circuit. Further, in an embodiment, forming the first and second CEM devices within a particular layer of an integrated circuit may include forming the CEM devices at least in part by selective deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method comprising:
   exposing a substrate, in a chamber, to a first precursor in a gaseous state, the first precursor comprising a transition metal oxide, a transition metal or a transition metal compound, or any combination thereof, and a first ligand;
   exposing the substrate to a second precursor in a gaseous state, the second precursor comprising an oxide so as to form a first layer of a film of correlated electron material; and
   repeating the exposing of the substrate to the first and second precursors a sufficient number of times so as to form additional layers of the film of correlated electron material, the film of correlated electron material exhibiting a first impedance state and a second impedance state, the first impedance state and the second impedance state to be substantially dissimilar from one another, at least 90% of the atomic concentration of the film of correlated electron material comprising the transition metal, the transition metal oxide the transition metal compound, or any combination thereof.

2. The method of claim 1, wherein the film of correlated electron material comprises an electron back-donating material in an atomic concentration of between 0.1% and 10.0%.

3. The method of claim 2, wherein the electron back-donating material comprises carbonyl.

4. The method of claim 1, further comprising purging the chamber of the first precursor for between 0.5 seconds and 180.0 seconds.

5. The method of claim 1, wherein the exposing of the substrate to the first precursor occurs over a duration of between 0.5 seconds and 180.0 seconds.

6. The method of claim 1, further comprising repeating the exposing of the substrate between 50 and 900 times.

7. The method of claim 1, further comprising repeating the exposing of the substrate until a thickness of the film of correlated electron material reaches between 1.5 nm and 150.0 nm.

8. The method of claim 1, the first precursor comprising nickel amidinate (Ni(AMD)), nickel dicyclopentadienyl (Ni($Cp$)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni(CH$_3$C$_5$H$_4$)$_2$), nickel dimethylglyoximate (Ni(dmg)$_2$), nickel 2-amino-pent-2-en-4-onato (Ni(apo)$_2$), Ni(dmamb)$_2$ (in which dmamb=1-dimethylamino-2-methyl-2-butanolate), Ni(dmamp)$_2$ (in which dmamp=1-dimethylamino-2-methyl-2-propanolate), Bis(pentamethylcyclopentadienyl)nickel (Ni(C$_5$(CH$_3$)$_5$)$_2$) or nickel carbonyl (Ni(CO)$_4$), or any combination thereof.

9. The method of claim 1, wherein the second precursor comprises oxygen (O$_2$), ozone (O$_3$), water (H$_2$O), nitric oxide (NO), nitrous oxide (N$_2$O) or hydrogen peroxide (H$_2$O$_2$), or any combination thereof.

10. The method of claim 1, wherein the exposing of the substrate to the first precursor, the exposing of the substrate to a second precursor, or any combination thereof, occurs at a temperature of between 20.0° and 1000.0° C.

11. The method of claim 1, additionally comprising annealing the exposed substrate in the chamber.

12. The method of claim 11, further comprising raising the temperature of the chamber to between 20.0° C. and 900.0° C. prior to initiating the annealing.

13. The method of claim 11, wherein the exposed substrate is annealed in an environment comprising gaseous nitrogen (N$_2$), hydrogen (H$_2$), oxygen (O$_2$), water or steam (H$_2$O), nitric oxide (NO), nitrous oxide (N$_2$O), nitrogen dioxide (NO$_2$), ozone (O$_3$), argon (Ar), helium (He), ammonia (NH$_3$), carbon monoxide (CO), methane (CH$_4$), acetylene (C$_2$H$_2$), ethane (C$_2$H$_6$), propane (C$_3$H$_8$), ethylene (C$_2$H$_4$) or butane (C$_4$H$_{10}$), or any combination thereof.

14. The method of claim 1, wherein the transition metal comprises aluminum, cadmium, chromium, cobalt, copper, gold, iron, manganese, mercury, molybdenum, nickel, palladium, rhenium, ruthenium, silver, tin, titanium, vanadium, or zinc.

* * * * *